United States Patent
Fujikawa

(10) Patent No.: US 7,042,270 B2
(45) Date of Patent: May 9, 2006

(54) INTERFACE SYSTEM BETWEEN CONTROLLER IC AND DRIVER IC, AND IC SUITABLE FOR SUCH INTERFACE SYSTEM

(75) Inventor: Akio Fujikawa, Kyoto (JP)

(73) Assignee: Rohm Co., LTD, Kyoto (JP)

( * ) Notice: Subject to any disclaimer, the term of this patent is extended or adjusted under 35 U.S.C. 154(b) by 0 days.

(21) Appl. No.: 10/274,012

(22) Filed: Oct. 18, 2002

(65) Prior Publication Data
US 2003/0080797 A1  May 1, 2003

(30) Foreign Application Priority Data
Oct. 30, 2001  (JP) ............................ 2001-332014

(51) Int. Cl.
*H03L 5/00*  (2006.01)
(52) U.S. Cl. ...................... 327/333; 327/309; 326/62; 326/80
(58) Field of Classification Search ................ 327/309, 327/310, 312, 314, 320, 331, 333; 361/56, 361/59, 91.1, 91.5, 111, 117, 118, 58; 257/358, 257/355; 326/30; 357/23.13
See application file for complete search history.

(56) References Cited
U.S. PATENT DOCUMENTS

| | | | | |
|---|---|---|---|---|
| 4,301,379 A | * | 11/1981 | Reinert | 327/205 |
| 4,745,477 A | * | 5/1988 | Bell et al. | 348/532 |
| 4,763,184 A | * | 8/1988 | Krieger et al. | 257/362 |
| 5,124,877 A | * | 6/1992 | Graham | 361/212 |
| 5,338,988 A | * | 8/1994 | Yamamura et al. | 327/306 |
| 5,430,602 A | * | 7/1995 | Chin et al. | 261/212 |
| 5,570,005 A | * | 10/1996 | Hardee et al. | 323/314 |
| 5,754,381 A | * | 5/1998 | Ker | 361/56 |
| 5,818,088 A | * | 10/1998 | Ellis | 257/355 |
| 5,903,184 A | * | 5/1999 | Hiraga | 327/546 |
| 6,144,542 A | * | 11/2000 | Ker et al. | 361/111 |
| 6,320,230 B1 | * | 11/2001 | Yu | 257/355 |
| 6,369,427 B1 | * | 4/2002 | Williamson | 257/355 |
| 6,411,122 B1 | * | 6/2002 | Mughal et al. | 326/30 |
| 6,611,025 B1 | * | 8/2003 | Lin | 257/355 |
| 6,873,203 B1 | * | 3/2005 | Latham et al. | 327/538 |

* cited by examiner

*Primary Examiner*—Tuan T. Lam
*Assistant Examiner*—Hiep Nguyen
(74) *Attorney, Agent, or Firm*—Hogan & Hartson, LLP

(57) ABSTRACT

A disk controller IC (11), driven by a first supply voltage (V1), is provided with a push-pull type output circuit having an output terminal (P1). The output circuit may be turned ON/OFF by a control signal. On the other hand, disk driver IC (12) is provided with a first voltage and a series of a pull-up resistor (R1) and a diode (D3) connected in series between an input terminal and the first supply voltage. An interface is established for the ICs (11, 12) by connecting the output terminal (P1) and the input terminal (P2) together.

8 Claims, 5 Drawing Sheets

INTERFACE SYSTEM BETWEEN CONTROLLER IC AND DRIVER IC, AND IC SUITABLE FOR SUCH INTERFACE SYSTEM

FIELD OF THE INVENTION

The invention relates to an interface system for interfacing integrated circuits (ICs) of a disk controller and a disk driver for use in a magnetic recording system such as a floppy disk drive and a hard disk drive.

BACKGROUND OF THE INVENTION

A standard interface (I/F) between an integrated circuit of a disk controller (hereinafter referred to as disk controller IC) and an integrated circuit of a disk driver (hereinafter referred to as disk driver IC) for use in a magnetic recording system such as a floppy disk drive (FDD) and a hard disk drive (HDD) has a circuit arrangement as shown in FIG. 1.

As shown in FIG. 1, a typical disk controller IC 31 uses a second supply voltage V2 of 5 V given by the difference in potential of a third power supply of potential E3 (=5V) and a second power supply (ground) of potential Egnd. An N type MOSFET Q1 is connected between the I/F output terminal P1 of the disk controller IC and the ground, making an open drain type output transistor. A block 33 represents a built-in circuit, other than the output transistor in the IC 31, which is driven by the second supply voltage V2 (5 V). In actuality, however, the voltage V2 may be 3 V for example.

In the disk driver IC 32, a second supply voltage V2 (=5 V) given by the difference between a third potential E3 (5 V) of a third power supply and the potential Egnd of the second power supply (ground). The 5-Volt second supply voltage V2 is used as a standard I/F voltage even when the operating voltage of the internal circuit of disk driver IC 32 is lower (e.g. 3 V) than V2.

In what follows it is assumed for simplicity that in each of the ICs 31 and 32 a first supply voltage V1 (3 V) is established between the potential E1 (=3V) of a first power supply and the ground potential Egnd (the ground being a second power supply), and that the second supply voltage V2 (=5 V) is established between the third potential E3 (5 V) of a third power supply and the ground potential Egnd. (The first and the third power supplies will be also referred to by the same reference codes E1 and E3, respectively, as their potentials.)

In the circuit arrangement shown in FIG. 1, the potential E3 (=5 V) of the third power supply is coupled with an I/F input terminal P2 via a pull-up resistor R1. The potential E3 is also coupled with the input terminal of a buffer B1. Resistors R2 and R3 are protective resistors for protecting the I/F circuit. The resistance of the resistor R2 is negligibly small as compared with the pull-up resistor R1. Since the resistors R2 and R3 are connected in series to the input terminal of the buffer B1, they do not affect the input voltage of the buffer B1.

The buffer B1 is an input buffer driven by the voltage between either potential of the first power supply E1 or the third power supply E3 and the ground potential Egnd depending on whether the operating voltage of a subsequent circuit connected to the buffer is the first supply voltage V1 (=3 V) or the second supply voltage V2 (=5 V). In the example shown in FIG. 1, the operating voltage of the subsequent circuit is assumed to be the second supply voltage V2. Diodes D1 and D2 are voltage surge protection diodes for causing positive/negative anomalous voltage surges, due to electrostatic charges for example, entering the input terminal P2 of the I/F to be absorbed by the third power supply E3 or the ground Egnd.

In this arrangement, the output terminal P1 and the input terminal P2 are connected. The N type MOSFET Q1 is turned ON/OFF in accordance with control signal SIG. The input of the buffer B1 will be pulled down to a low potential level (or the ground potential Egnd) as the N type MOSFET Q1 is turned on, while the buffer B1 will be pulled up to a high potential (or the third potential E3) as N type MOSFET Q1 is turned off.

Thus, irrespective of the supply voltage of the IC 31 being 5 V or 3 V, the voltage input to the IC 32 is converted by the I/F to the operating voltage of the internal circuit of the disk driver. The operating voltage is output from the buffer B1. It is noted that the buffer B1 often has a hysteresis characteristic.

A conventional I/F circuit as mentioned above has a drawback, however, when it is used with a recent ½-inch height floppy disk drive (FDD) for example which utilizes a disk controller having a standard push-pull type output circuit. In this case, the IC 32 is connected to a push-pull type I/F circuit of a disk controller IC 41, as shown in FIG. 2. The output voltage of such push-pull type IC 41 is mostly 3 V.

FIG. 2 shows an exemplary I/F structure established between the disk controller IC 41 having a CMOS type 3-V output circuit and a disk driver IC 42.

As shown in FIG. 2, the IC 41 is provided with a first supply voltage V1 of 3 V. The CMOS type output circuit comprises a serially connected P type MOSFET Q2 and N type MOSFET Q1 coupled between a first power supply having a first potential E1 and a second power supply (normally the ground) of potential Egnd. It is often the case that the IC 42 of a disk driver is a conventional IC 32 as shown in FIG. 1.

The MOSFET Q1 and MOSFET Q2 are turned ON/OFF in response to a control signal SIG applied thereto. When the N type MOSFET Q1 is ON and the P type MOSFET Q2 is OFF, conditions of the two ICs are similar to that shown in FIG. 1 and no problem exists. However, when the N type MOSFET Q1 is turned off and P type MOSFET Q2 is turned on, the potential of the I/F output terminal P1, and hence the potential of the input terminal of the buffer B1, is substantially the same as the first supply voltage E1, which is about 3 V.

In this case, a current flows from the third power supply E3 of the disk driver to the first power supply E1 of the disk controller via the pull-up resistor R1 and the protective resistor R2. The current contributes to unnecessary Joule heat in the pull-up resistor R1. On the other hand, when the P type MOSFET Q2 is turned on and the power supply of the IC 42 is cut off, power is disadvantageously supplied from the IC 41 to the IC 42 via the pull-up resistor R1 or the diode D1.

SUMMARY OF THE INVENTION

It is, therefore, an object of the invention to provide an interface system between a disk controller IC and a disk driver IC for use in a drive of a magnetic recording system free of such unnecessary current from the disk controller IC into the disk driver IC pertinent to prior art I/Fs even when the disk controller IC has a low-voltage push-pull type output circuit.

It is another object of the invention to provide an interface system that can be used with a disk controller IC having an open-output type output circuit.

In one aspect of the invention, there is provided an interface system for interfacing two ICs, comprising:

a first IC having a push-pull type output circuit impressed with a first supply voltage given by the difference in potential of a first and a second power supply, said output circuit controlled to be ON or OFF by a control signal and an output terminal for outputting the output signal of said first IC; and a second IC having an input terminal connected to said output terminal of said first IC for receiving said output of said first IC as the input signal to said second IC, and a pull-up/down resistor and a first diode connected in series with said pull-up/-down resistor, both coupled between said input terminal and one of a first and a second power supply having a first and a second potential, respectively, such that said pull-up/down resistor is capable of being pulled up/down.

In anther aspect of the invention, there is provided an interface system for interfacing two ICs, comprising:

a first IC having an output terminal for outputting the output signal thereof, an open-output type output circuit connected between said output terminal and one of a first and a second power supply having a first and a second potential, respectively, and turned ON/OFF in response to a control signal; and a second IC having an input terminal connected to said output terminal of said first IC for receiving the output of said first IC as the input signal to said second IC, and a pull-up/down resistor and a first diode connected in series with said pull-up/down resistor, both coupled between said input terminal and one of a first and a second power supply having a first and a second potential, respectively, such that said pull-up/down resistor is capable of being pulled up/down.

In a further aspect of the invention, there is provided an IC, comprising:

an input terminal for inputting an input signal;

a pull-up/down resistor, and a diode connected in series with said pull-up/-down resistor, both coupled between said input terminal and one of a first and a second power supply having a first and a second potential, respectively, such that said pull-up/down resistor is capable of being pulled up/down; and a buffer fed with said input signal and driven by a first supply voltage given by the difference in potential of said first and second power supplies.

DETAILED DESCRIPTION OF THE PREFERRED EMBODIMENT

The invention will now be described with reference to preferred embodiments of an interface (I/F) system for interfacing a disc controller IC and a disk driver IC and ICs for use in the interface, as shown in accompanying drawings.

Figure 3:
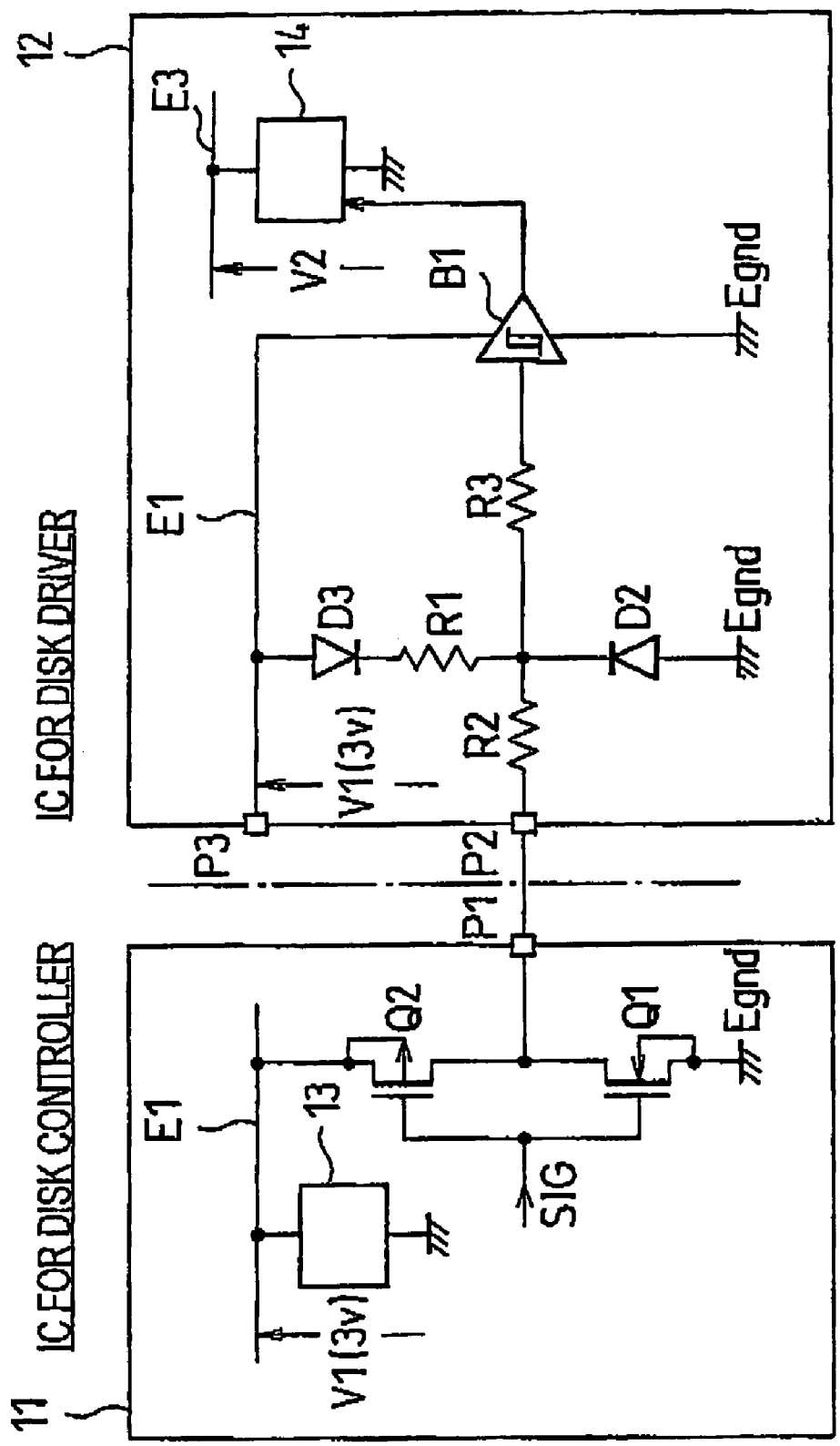
FIG. 3 shows an embodiment of an interface system and ICs according to the invention.

Referring to FIG. 3, there is shown an I/F system for interfacing a first IC 11 of a disk controller (said first IC herein after referred to as disk controller IC) and a second IC 12 of a disk driver (said second IC herein after referred to as disk driver IC) for use in a drive of a magnetic recording apparatus.

Figure 2:
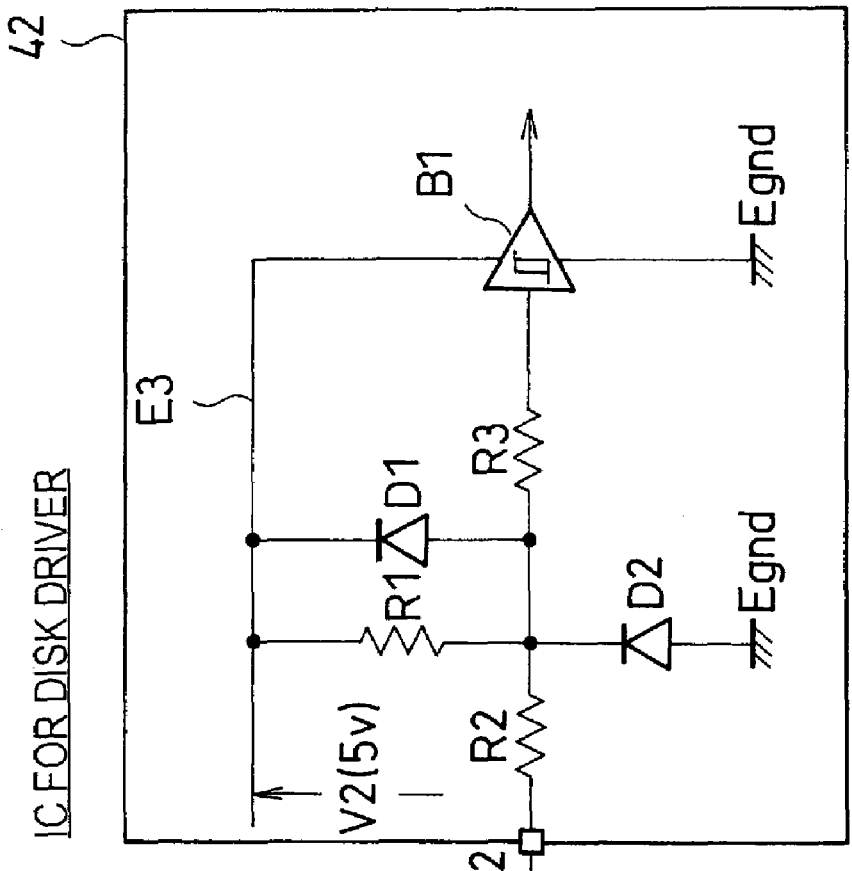
FIG. 2 shows anther conventional interface system and ICs for use in the interface.

The IC 11 shown in FIG. 3 is identical to IC 41 shown in FIG. 2, which utilizes a 3-V first supply voltage V1 and has a push-pull type CMOS output circuit consisting of a P type MOSFET Q2 and an N type MOSFET Q1 connected in series between a first power supply having a potential E1 and a second power supply having a ground potential Egnd. A block 13 represents a further built-in circuit provided in the IC 11. The circuit 13 is shown to be operated by the first supply, voltage V1 of 3 V. However, the voltage V1 can be different from 3 V.

Figure 1:
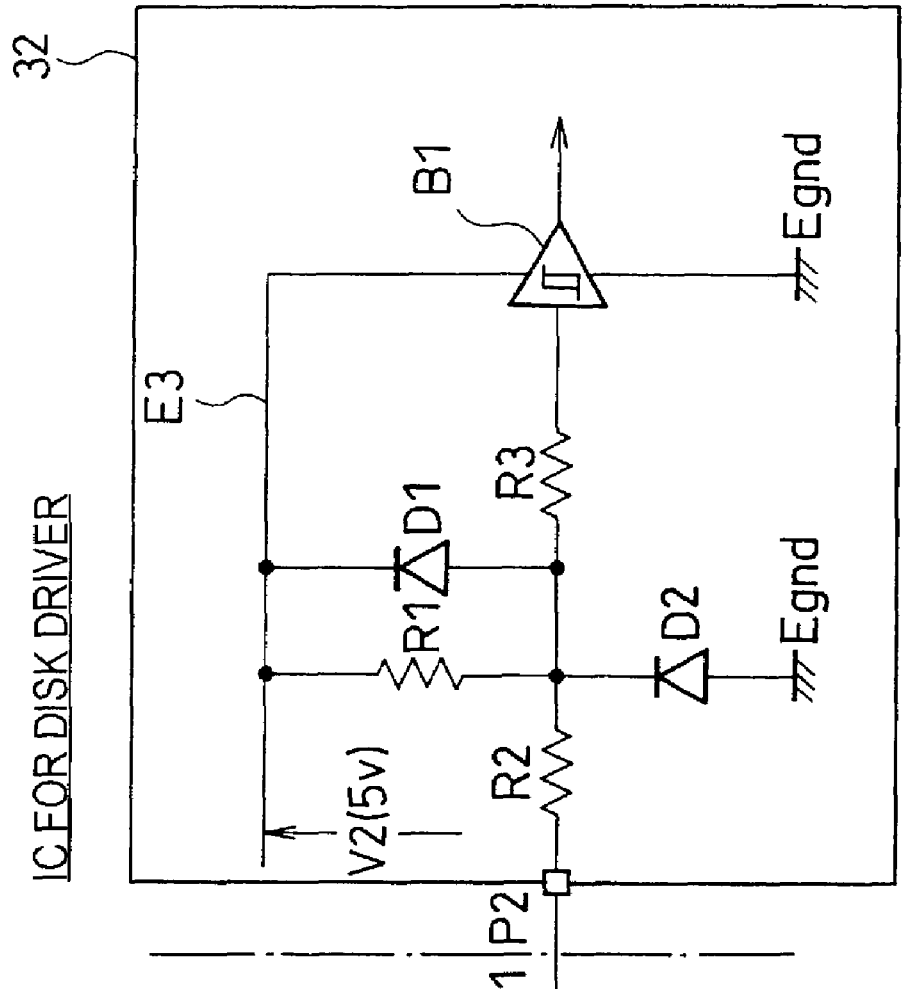
FIG. 1 shows a conventional interface system and ICs for use in the interface.

The IC 12 has an input circuit that operates at the same first supply voltage V1 of 3 V of the first IC 11. Connected between the first power supply having of potential E1 and the input terminal P2 of the I/F is a diode D3 connected in series with a pull-up resistor R1 in such a way that a current flows through the diode in the forward direction, i.e. in the direction towards the I/F input terminal P2. The pull-up resistor R1 can be made of polysilicon. The diode D2 is a voltage surge protection diode for discharging anomalous negative voltage surge arising from electrostatic charges and entering the input terminal P2 to the ground. Resistors R2 and R3 are the same as those described in connection with FIG. 1.

Buffer B1 has a hysteresis characteristic and is operable at a voltage given by the difference between the potential E1 of the first power supply and the ground Egnd if the operating voltage of the internal circuit receiving the output of the buffer B1 is the first supply voltage V1. In this case, the threshold value of the buffer B1 is set to a substantial mean potential of the potential E1 of the first power supply and the ground potential Egnd.

The buffer B1 is normally formed of a complementary MOS (CMOS). Like a convention buffer as shown in FIG. 2, if the operating voltage of the buffer B1 is the second supply voltage V2 (5 V), it is necessary to set the input threshold voltage Vth of the CMOS to a low level that matches the voltage V1 of the input signal. To do so in a conventional CMOS, the proportion of area occupied by the P type MOSFET to that of the N type MOSFET forming the CMOS is unbalanced (i.e the ratio W/L of the channel width W and the channel length L is offset from 1).

In the present invention, however, since the operating voltage of the buffer B1 is the first supply voltage V1 (3 V), the threshold voltage Vth of the buffer B1 is set to an intermediate potential between the potential E1 (3 V) of the first power supply and the ground potential Egnd. Accordingly, it is not necessary to unbalance the area of the P type MOSFET to that of the N type MOSFET forming the CMOS. This allows the use of MOSFETs having a minimum size, which in turn permits saving the space inside the IC.

Block 14 represents a further built-in circuit provided in the IC 12, presumably operating at the second supply voltage V2 (5 V). The operating voltage of the circuit 14, however, need not be limited to 5 V. For example, it can be V1 (3 V). When the circuit 14 is operated by the second supply voltage V2 (5 V), the IC 12 requires a further terminal P3 for externally supplying the first supply voltage V1 (3 V).

Next, operations of the I/F system when the interfacing output terminal P1 of the IC 11 is connected to the interfacing input terminal P2 of the IC 12 will be described.

As the N type MOSFET Q1 is turned on when the control signal SIG is HIGH, the input terminal P2 of the I/F is supplied with a LOW input signal, since the resistance of the N type MOSFET Q1 is then sufficiently small as compared with the resistances of the pull-up resistor R1 and the protective resistor R2. Since the buffer B1 is supplied with the signal whose voltage level is well below the input threshold voltage of the buffer B1, it supplies a low level output to the internal circuit.

When the P type MOSFET Q2 is turned on when the control signal SIG is LOW, the input terminal P2 of the I/F is supplied with a HIGH input signal of V1 (=3 V). The driving voltage for the buffer B1 is the first supply voltage V1. On the other hand, the input threshold voltage Vth of the buffer B1 is well below the voltage V1. As a result, the voltage of the input signal exceeds the input threshold voltage Vth of the buffer B1, thereby allowing the buffer B1 to provide a HIGH level output to the internal circuit.

In the example shown herein, the IC 12 is adapted to have the same supply voltage for the internal circuit thereof as the first supply voltage V1 of the IC 11. Thus, the invention prevents a wasteful current from flowing from the disk driver to the disk controller via the pull-up resistor R1 as observed in conventional I/Fs. It should be appreciated that the pull-up resistor R1 can be made smaller in both heat capacity and area than conventional ones.

Further, since IC 12 of the invention is provided with the serially connected diode D3 and the pull-up resistor R1 such that a current can flow through them in the direction towards the input terminal P2, no current will flow from the IC 11 to the IC 12 even if the output potential of the disk driver IC 12 is lowered or the supply voltage of the IC 12 is cut off.

The surge voltage protection diode D2 allows a negative anomalous voltage surge that has arisen from electrostatic charge and entered the input terminal P2 to be absorbed by the ground. On the other hand, no dedicated protective diode is provided for a positive anomalous voltage surge. However, such positive voltage surge will cause an avalanche in the reverse-current preventive diode D3 so that it is absorbed by the first power supply E1 via the avalanched diode D3.

Figure 4:
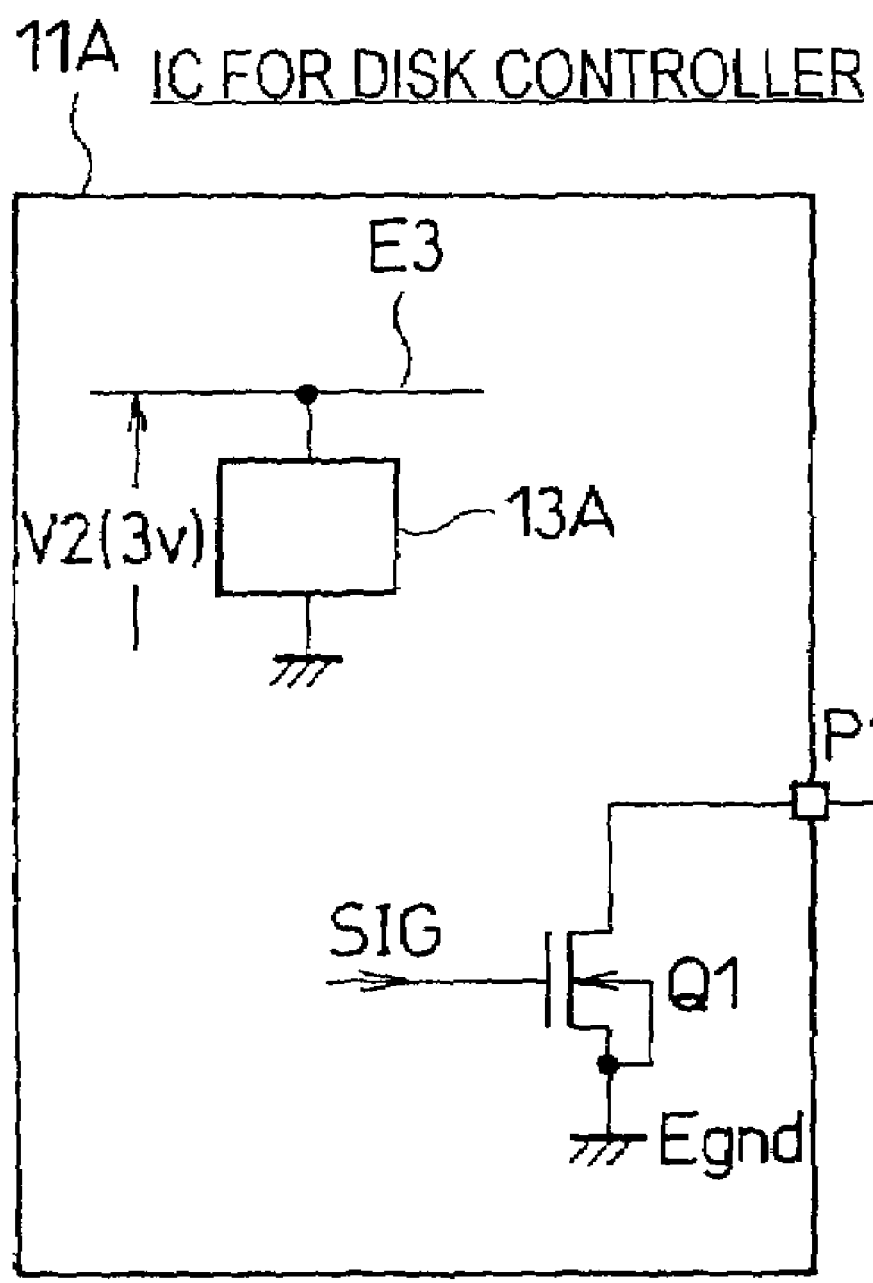
FIG. 4 shows an IC for use in the interface of the invention.

It will be appreciated that the IC 12 shown in FIG. 3 may be used in combination with a disk controller IC-11A having an open-drain type output circuit as shown in FIG. 4, in just the same way as with a disk controller having a push-pull type output circuit. The structure of the IC shown in FIG. 4 is the same as that of IC 31 shown in FIG. 1.

In this case, the output terminal P1 of the IC 11A of FIG. 4 is connected to the input terminal P2 of the IC 12 shown in FIG. 3. Under this condition, as the N type MOSFET Q1 is turned on in response to the control signal SIG, the potential of the input terminal P2, hence the potential of the input terminal of the buffer B1, is pulled down LOW. Conversely, as the N type MOSFET Q1 is turned off, the input voltage of the buffer B1 is pulled up by the serially connected pull-up resistor R1 and the diode D3 to a HIGH level (E1−Vf), where Vf is the voltage drop across the diode D3 in the forward direction. Consequently, the buffer B1 determines that the input voltage is HIGH. Accordingly, the buffer B1 provides an output power in accord with the input potential to drive the internal circuit of the IC 12.

When the IC 11A has an open-drain type output circuit in which the P type MOSFET has one end connected to the potential E1 of the first power supply, the diodes D2 and D3 and the resistor R1 may be reversed in arrangement so that the HIGH level voltage can be absorbed by the power supply and the output voltage may be pulled down. In this case, the diode D2 is connected between the potential E1 of the first power supply and the input terminal P2, in the direction such that a high positive potential appearing at the input terminal P2 is absorbed by the first power supply. At the same time, resistor R2 and diode D3 are serially connected between the ground Egnd and the input terminal P2 such that the potential level of the input terminal P2 may be pulled down.

In this manner, the IC 12 can interface different types of disk controller ICs 11 and 11A, irrespective of whether the output circuit is of a push-pull type or open-drain type.

Figure 5:
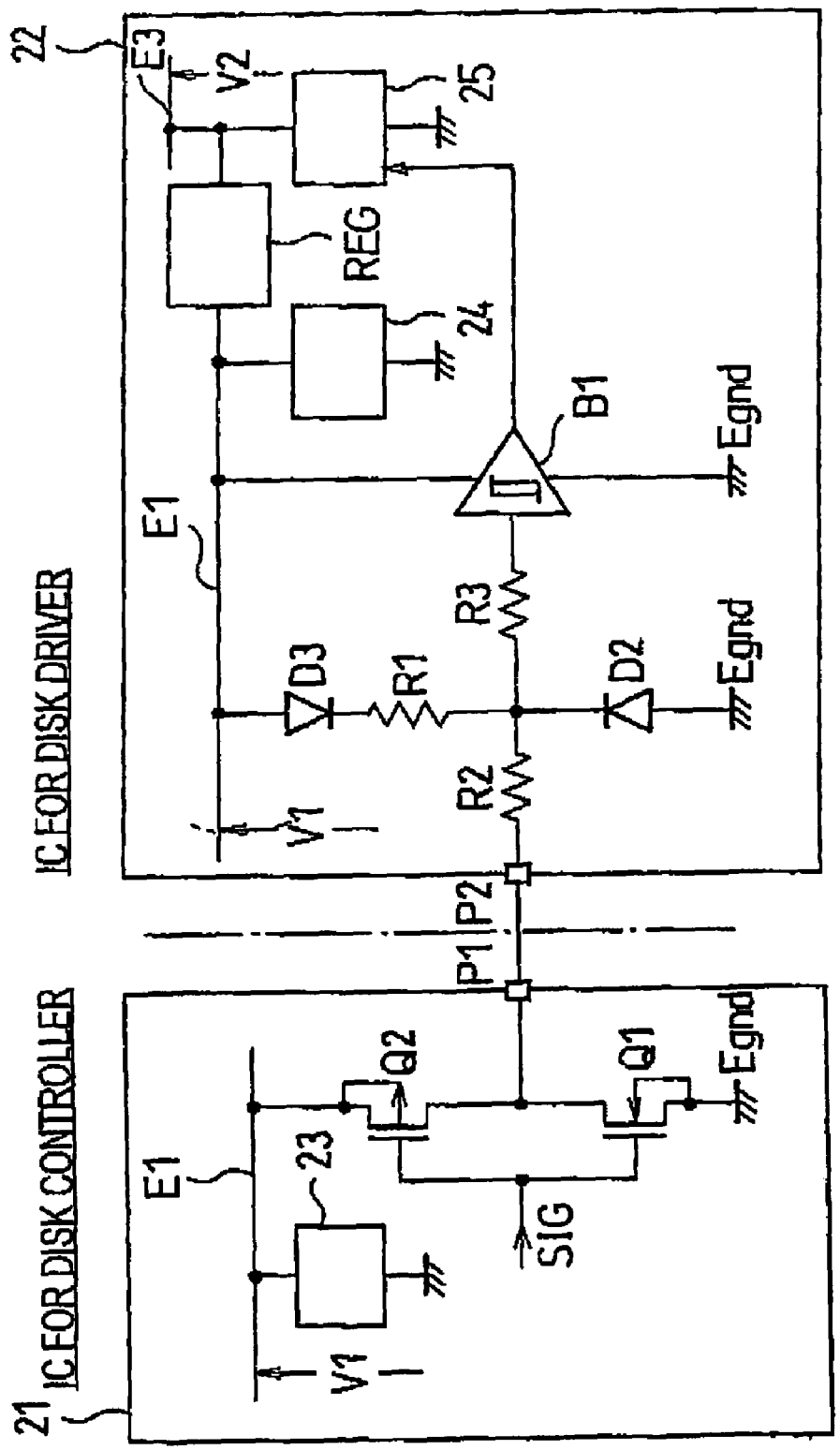
FIG. 5 shows another embodiment of an IC for use in the interface system according to the invention.

FIG. 5 shows a disk driver IC 22 which is obtained by adding a voltage regulation circuit REG to the disk drive IC 12 of FIG. 3. The disk controller IC 21 is the same as the IC 11 of FIG. 3. Blocks 24 and 25 represent further built-in circuits provided in the IC 11, which are driven by the first supply voltage V1 (3V) and the second supply voltage V2 (5 V), respectively. The circuit shown in FIG. 5 is the same as the one shown in FIG. 3 except for the voltage regulation circuit REG and the circuits 24 and 25.

The voltage regulation circuit REG is provided to obtain the first supply voltage V1 (3 V) from the second supply voltage V2 (5 V) through voltage regulation. The circuit of FIG. 5 has a feature that if the second supply voltage V2 fluctuates, the first supply voltage V1 can be stabilized by virtue of the voltage regulation circuit REG. Thus, the input characteristics of the buffer B1 is improved.

It will be clear to those skilled in the art that although MOSFETs are used in the above described output circuits NPN type and PNP type bipolar transistors may be used equally well. When bipolar transistors are used, the output circuits have an open-collector configuration. As described above, the buffer B1 may have a hysteresis characteristic. However, it may have another characteristic.

In the embodiments described above the disk driver ICs are controlled by the control signal received from the disk controller IC. The invention may be applied equally well to an interface system in which the disk controller IC is conversely controlled by a control signal received from the disk driver IC.

I claim:

1. An interface system for interfacing two ICs, comprising:
    a first IC having
    a push-pull type output circuit coupled between a first supply voltage and the ground, said push pull type output circuit controlled to be ON or OFF by a control signal, and
    an output terminal for outputting an output signal of said first IC; and
    a second IC having
    an input terminal connected to said output terminal of said first IC for receiving said output of said first IC as the input signal to said second IC,
    an internal circuit having a second power supply voltage higher than said first power supply voltage as an operating voltage,
    a terminal for supplying said first power supply voltage to said second IC, a buffer circuit connected to said first power supply voltage and the ground, wherein input signal of said input terminal is supplied to said buffer circuit and output signal of said buffer circuit for driving said internal circuit is generated, and a pull-up resistor and a pull up diode connected in series with said pull-up resistor, coupled between said input terminal and said first power supply voltage, wherein said pull-up diode is provided to a direction such that the anode of said pull-up diode is on the side of said first power supply voltage, and the cathode of said pull-up diode is on the side of said input terminal.

2. The interface system according to claim 1, wherein said second IC has a voltage surge protection diode connected between said input terminal and the ground, wherein said voltage surge protection diode is provided to a direction such that the anode of said voltage surge protection diode is on the side of the ground, and the cathode of said voltage surge protection diode is on the side of said input terminal.

3. The interface system according to claim 2, wherein said first IC is a controller IC of a drive of a magnetic recording apparatus and said second IC is a disk driver IC of said magnetic recording apparatus.

4. An interface system for interfacing two ICs, comprising:

a first IC having a push-pull type output circuit coupled between a first supply voltage and the ground, said push-pull type output circuit controlled to be ON or OFF by a control signal, and an output terminal for outputting an output signal of said first IC;

and a second IC having an input terminal connected to said output terminal of said first IC for receiving the output signal of said first IC as the input signal to said second IC, an internal circuit having a second power supply voltage higher than said first power supply voltage as an operating voltage, a voltage regulation circuit obtaining said first supply power voltage from said second supply voltage, a buffer circuit, connected to said first power supply voltage and the ground, wherein input signal of said input terminal is supplied to said buffer circuit and output signal of said buffer circuit for driving said internal circuit is generated, and a pull-up resistor and a pull-up diode connected in series with said pull-up resistor, coupled between said input terminal and said first supply voltage, wherein said pull-up diode is provided to a direction such that the anode of said pull-up diode is on the side of said first power supply voltage, and the cathode of said pull-up diode is on the side of said input terminal.

5. The interface system according to claim 4, wherein said second IC has a voltage surge protection diode connected between said input terminal and the ground, wherein said voltage surge protection diode is provided to a direction such that the anode of said voltage surge protection diode is on the side of the ground, and the cathode of said voltage surge protection diode is on the side of said input terminal.

6. The interface system according to claim 5, wherein said first IC is a controller IC of a drive of a magnetic recording apparatus and said second IC is a disk driver IC of said magnetic recording apparatus.

7. An IC, comprising:

an input terminal for inputting an input signal;

a pull-up resistor and a pull-up diode connected in series with said pull-up resistor, coupled between said input terminal and a first power supply voltage, wherein said pull-up diode is provided to a direction such that the anode of said pull-up diode is on the side of said first power supply voltage, and the cathode of said pull-up diode is on the side of the said input terminal;

an internal circuit having a second power supply voltage higher than said first power supply voltage as an operating voltage, a buffer circuit fed with said input signal and connected to said first power supply voltage and the ground, said buffer circuit generating output signal for driving said internal circuit; and a voltage regulation circuit for forming said first power supply voltage from said second power supply voltage.

8. An IC, comprising:

an input terminal for inputting an input signal;

a pull-up resistor and a pull-up diode connected in series with said pull-up resistor, coupled between said input terminal and a first power supply voltage, wherein said pull-up diode is provided to a direction such that the anode of said pull-up diode is on the side of said first power supply voltage, and the cathode of said pull-up diode is on the side of said input terminal;

an internal circuit having a second power supply voltage higher than said first power supply voltage as an operating voltage, a terminal for supplying said first power supply voltage to said IC, a buffer circuit fed with said input signal and connected to said first power supply voltage and the ground, said buffer circuit generating output signal for driving said internal circuit.

* * * * *